(12) United States Patent
Hsieh

(10) Patent No.: US 11,445,629 B2
(45) Date of Patent: Sep. 13, 2022

(54) FASTENER FOR USE IN ELECTRONIC DEVICE

(71) Applicant: KANG YANG HARDWARE ENTERPRISES CO., LTD., New Taipei (TW)

(72) Inventor: Shu-Li Hsieh, New Taipei (TW)

(73) Assignee: KANG YANG HARDWARE ENTERPRISES CO., LTD., New Taipei (TW)

( * ) Notice: Subject to any disclaimer, the term of this patent is extended or adjusted under 35 U.S.C. 154(b) by 249 days.

(21) Appl. No.: 17/028,078

(22) Filed: Sep. 22, 2020

(65) Prior Publication Data

US 2022/0030730 A1   Jan. 27, 2022

(30) Foreign Application Priority Data

Jul. 27, 2020   (TW) .................................. 109209586

(51) Int. Cl.
 *H05K 7/00* (2006.01)
 *H05K 7/12* (2006.01)

(52) U.S. Cl.
 CPC ..................... *H05K 7/12* (2013.01)

(58) Field of Classification Search
 CPC ........................................................ H05K 7/12
 See application file for complete search history.

(56) References Cited

U.S. PATENT DOCUMENTS

| 7,335,032 | B1* | 2/2008 | Lee | H05K 7/1405 |
|---|---|---|---|---|
| | | | | 439/76.1 |
| 7,467,963 | B2* | 12/2008 | Chen | H01R 27/00 |
| | | | | 439/328 |
| 7,563,119 | B2* | 7/2009 | Hsu | H05K 7/12 |
| | | | | 439/567 |
| 8,085,552 | B2* | 12/2011 | Takao | H05K 3/368 |
| | | | | 361/810 |
| 8,098,497 | B2* | 1/2012 | Chiang | H05K 7/142 |
| | | | | 361/810 |
| 8,130,489 | B2* | 3/2012 | Chan | G06F 1/185 |
| | | | | 361/740 |
| 8,579,645 | B2* | 11/2013 | Wang | H01R 12/83 |
| | | | | 439/326 |
| 8,608,501 | B2* | 12/2013 | Sun | H01R 12/7029 |
| | | | | 439/326 |
| 8,649,182 | B2* | 2/2014 | Ko | G06F 1/1633 |
| | | | | 361/755 |

(Continued)

*Primary Examiner* — Rockshana D Chowdhury
(74) *Attorney, Agent, or Firm* — Guice Patents PLLC

(57) ABSTRACT

A fastener for use in an electronic device includes a positioning unit and a clamping member. The positioning unit has a first supporting concave part allowing a first electronic device to be disposed, a fastening pin inserted in the positioning unit is disposed at a bottom end of clamping member, so that the bottom end of the clamping member enables the first electronic device to be in a locked status; the clamping member has a second supporting concave part allowing a second electronic device to be disposed, a chamber is at a location adjacent to one side of the second supporting concave part, and is connected to a sliding cover capable of radially and elastically sliding; with a front end of the sliding cover being released or be located above the second supporting concave part, the second electronic device can be in an unlocked status or a locked status.

11 Claims, 10 Drawing Sheets

(56) References Cited

U.S. PATENT DOCUMENTS

| | | | |
|---|---|---|---|
| 8,657,619 B2* | 2/2014 | Lin | G06F 1/185 |
| | | | 439/328 |
| 9,136,621 B1* | 9/2015 | Jaskela | H01R 12/73 |
| 9,271,062 B2* | 2/2016 | Wu | H05K 7/20172 |
| 9,414,505 B2* | 8/2016 | Hung | H05K 3/301 |
| 9,703,331 B1* | 7/2017 | Chien | G06F 1/185 |
| 9,910,466 B1* | 3/2018 | Strickland | H05K 7/1417 |
| 9,927,834 B2* | 3/2018 | Hua | G06F 1/16 |
| 10,349,542 B2* | 7/2019 | Chen | G06F 1/185 |
| 10,465,735 B1* | 11/2019 | Hsieh | F16B 37/043 |
| 10,608,355 B2* | 3/2020 | Chen | H01R 12/73 |
| 10,721,835 B2* | 7/2020 | Chen | H05K 7/1489 |
| 11,226,658 B2* | 1/2022 | Shen | G11B 33/124 |
| 11,262,813 B2* | 3/2022 | Tsorng | H05K 1/141 |
| 2007/0105425 A1* | 5/2007 | Wang | H05K 7/142 |
| | | | 439/326 |
| 2007/0202732 A1* | 8/2007 | Yahiro | H01R 13/6275 |
| | | | 439/326 |
| 2008/0137311 A1* | 6/2008 | Yang | G06F 1/185 |
| | | | 361/732 |
| 2009/0017664 A1* | 1/2009 | McAlonis | H05K 1/142 |
| | | | 439/326 |
| 2009/0180264 A1* | 7/2009 | Chiang | H05K 7/142 |
| | | | 361/752 |
| 2010/0062624 A1* | 3/2010 | Tsai | H05K 7/16 |
| | | | 439/74 |
| 2012/0289075 A1* | 11/2012 | Yeh | H05K 7/1053 |
| | | | 439/345 |
| 2013/0048814 A1* | 2/2013 | Zhou | G06F 1/186 |
| | | | 248/223.41 |
| 2013/0058054 A1* | 3/2013 | Zhou | G06F 1/185 |
| | | | 361/748 |
| 2013/0084128 A1* | 4/2013 | Yu | F16B 5/0016 |
| | | | 403/326 |
| 2013/0176696 A1* | 7/2013 | Sun | H01R 13/639 |
| | | | 29/729 |
| 2013/0288532 A1* | 10/2013 | Lai | G06F 1/185 |
| | | | 439/629 |
| 2014/0211403 A1* | 7/2014 | Ma | H05K 7/142 |
| | | | 361/679.32 |
| 2016/0249455 A1* | 8/2016 | Yang | F16B 5/0642 |
| 2016/0372083 A1* | 12/2016 | Taite | G06F 3/04886 |
| 2017/0090527 A1* | 3/2017 | Chi | H05K 7/12 |
| 2018/0342820 A1* | 11/2018 | He | H01R 12/52 |
| 2020/0244008 A1* | 7/2020 | Wu | F16B 21/02 |
| 2022/0030730 A1* | 1/2022 | Hsieh | H05K 7/12 |

* cited by examiner

A-A

B-B

C-C

FASTENER FOR USE IN ELECTRONIC DEVICE

BACKGROUND OF THE INVENTION

1. Field of the Invention

The present invention relates to a fastener, especially to a fastener for use in an electronic device, for example a M.2 solid state drive, a Wi-Fi wireless network card or 3G card.

2. Description of Related Art

A conventional electronic device, for example a M.2 solid state drive, has an insertion part with a plurality of contact terminal disposed at one end thereof, and another end thereof is provided with a positioning recess used for a purpose of positioning. The insertion part is inserted and connected to a connector preset on a board member, for example a printed circuit board, and the positioning recess at the another end is provided with a fastener, the fastener has a positioning unit inserted on the board member, and the positioning unit has a columnar body axially formed with an insertion hole, a top surface of the columnar body has a supporting concave part allowing the positioning recess of the electronic device to be disposed; and a clamping member having a clamping sheet, a positioning pin inserted in the insertion hole is axially protruded from a top surface of the clamping sheet, so that the clamping sheet is able to seal the supporting concave part, and the clamping sheet and the supporting concave part can jointly clamp the positioning recess, thereby enabling the electronic to be fastened on the board member and forming an electric connection between the electronic device and the connector.

However, with the trend of the electronic device being thin and impact, an internal space inside the electronic device is limited, so that multiple electronic components can only be arranged in a stacking means for efficiently using the internal space. The above-mentioned fastener can only allow single electronic device to be fastened on the board member, and cannot allow apply to a plurality of electronic devices; as such, the shortage shall be improved.

SUMMARY OF THE INVENTION

One primary objective of the present invention is to provide a fastener for use in an electronic device, in which with an arrangement of space partitions, the fastener allows one or more electronic devices, for example a M.2 solid state drive, a Wi-Fi wireless network card or 3G card, to be disposed, so that a stably electrical connection can be established between the one or more electronic devices and a connector corresponding disposed on a board member, for example a printed circuit board, thereby ensuring the one or more electronic devices to be normally operated.

For achieving said objective, one technical solution provided by the present invention is to provide a fastener for use in an electronic device, which includes a positioning unit, axially formed with an insertion hole, wherein a first supporting concave part allowing a first electronic device to be disposed is radially formed on one surface of the positioning unit, and another surface thereof has a positioning structure communicating with the insertion hole and allowing a board member to be connected; and a clamping member, having a main body, wherein a fastening pin inserted in the insertion hole is disposed at a bottom end of the main body, so that the bottom end of the main body enables the first electronic device disposed on the first supporting concave part to be in a locked status; the main body has a second supporting concave part allowing a second electronic device to be disposed and radially formed at a location opposite to the fastening pin, wherein an axial spacing distance is formed between the first supporting concave part and the second supporting concave part, a chamber is disposed at a location adjacent to one side of the second supporting concave part, the chamber has a pair of sliding slots oppositely arranged and a rod hole; and a sliding cover, having a sliding sheet axially protruded from a bottom surface thereof so as to be disposed in the chamber, two sides of the sliding sheet have a pair of sliding hooks buckled in the pair of sliding slots, and a sliding rod is protruded from the sliding sheet and sleeved with a spring, and the spring is located between the sliding sheet and the chamber; with the sliding cover sliding or being released, the spring is able to be in an energy storing status or an energy releasing status, so that a front end of the sliding cover is able to be released or be located above the second supporting concave part, thereby enabling the second electronic device to be in an unlocked status or a locked status.

According to one embodiment of the present invention, the insertion hole is in not a round hole, and a cross section of the fastening pin is formed in a shape which is the same as the insertion hole.

According to one embodiment of the present invention, two sides of the first supporting concave part have a pair of first blocking edges abutting against a first positioning recess of the first electronic device; and two sides of the second supporting concave part have a pair of second blocking edges abutting against a second positioning recess of the second electronic device.

According to one embodiment of the present invention, the positioning structure has at least two buckle hooks annularly arranged and protruded from a circumference of the insertion hole, the buckle hooks are used for being buckled in a board hole of the board member; wherein a length of the fastening pin is greater than a depth of the insertion hole, thus the fastening pin is allowed to protrude into a penetrated slot formed between the buckle hooks, and the buckle hooks are prevented from inwardly retracting and deforming.

According to one embodiment of the present invention, a rotation preventing protrusion protruding from a circumference of the insertion hole is disposed between every two of the adjacent buckle hooks, and the rotation preventing protrusion is inserted in a rotation preventing hole communicating with the board hole.

According to one embodiment of the present invention, a connecting strip is further provided, one end of the connecting strip is connected to the positioning unit, and another end thereof is connected to the main body of the clamping member, so that the positioning unit, the clamping member and the connecting strip are allowed to be formed through a high polymer insulation material being processed with an injection molding treatment.

According to one embodiment of the present invention, an anti-loosening structure is correspondingly disposed at adjacent circumferences of the fastening pin and the insertion hole.

According to one embodiment of the present invention, the anti-loosening structure has at least one anti-loosening buckle slot formed at an outer circumference of the fastening pin, and an anti-loosening buckle ring disposed at an inner circumference of the insertion hole; or the anti-loosening structure has an anti-loosening buckle ring formed at the outer circumference of the fastening pin, and at least one anti-loosening buckle slot formed at the inner circumference of the insertion hole.

According to one embodiment of the present invention, the chamber has a front wall and a rear wall oppositely arranged above a bottom wall, and a pair of lateral walls connected between the front wall and the rear wall; wherein, the pair of sliding slots are oppositely formed on the pair of lateral walls, and the rod hole is formed on the rear wall.

According to one embodiment of the present invention, the pair of lateral walls are correspondingly formed with a pair of guiding inclined surfaces arranged above the pair of sliding slots, the sliding sheet has a guiding arc-shaped surface arranged between the pair of sliding hooks; when the guiding arc-shaped surface displaces along the pair of guiding inclined surfaces, the pair of guiding inclined surfaces are formed in a slightly expanding and deforming status for allowing the pair of sliding hooks to smoothly pass the pair of the guiding inclined surfaces so as to be buckled in the pair of sliding slots.

According to one embodiment of the present invention, the front wall has an accommodation slot, a reinforcing rib is integrally protruded from the sliding sheet at a location corresponding to the accommodation slot, and the reinforcing rib is received and abutted against the accommodation slot.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Please refer from FIG. 1 to FIG. 6, the present invention provides a fastener for use in an electronic device, for example a M.2. solid state drive, a Wi-Fi wireless network card or 3G card. The fastener includes a positioning unit 1 and a clamping member 2. The positioning unit 1 and the clamping member 2 are preferably to be formed through a high polymer insulating material, for example Nylon, being processed with an injecting molding treatment so as to be provided with an insulating effect.

Figure 2:
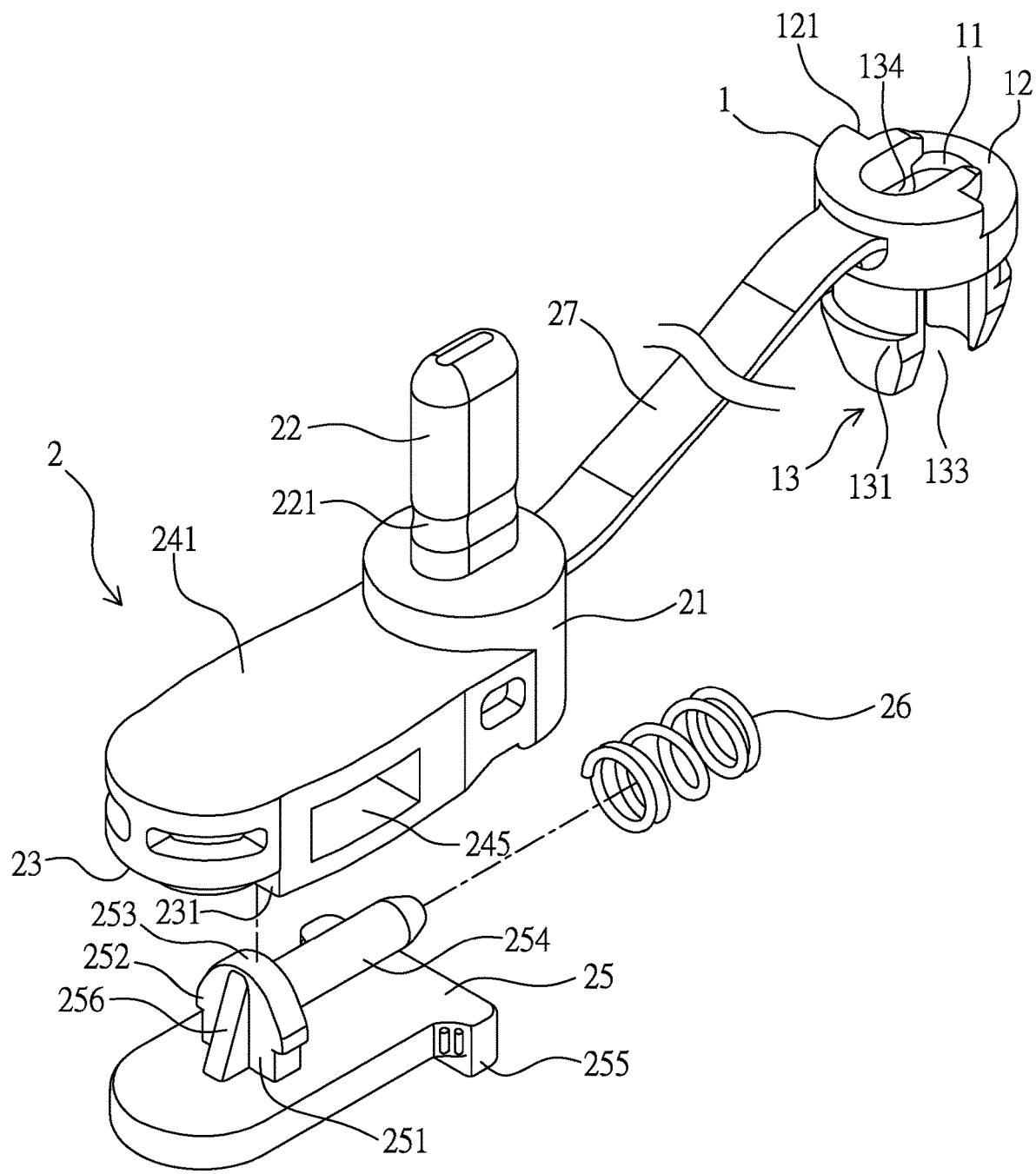
FIG. 2 is another perspective exploded view illustrating the fastener according to the present invention.
Figure 4:
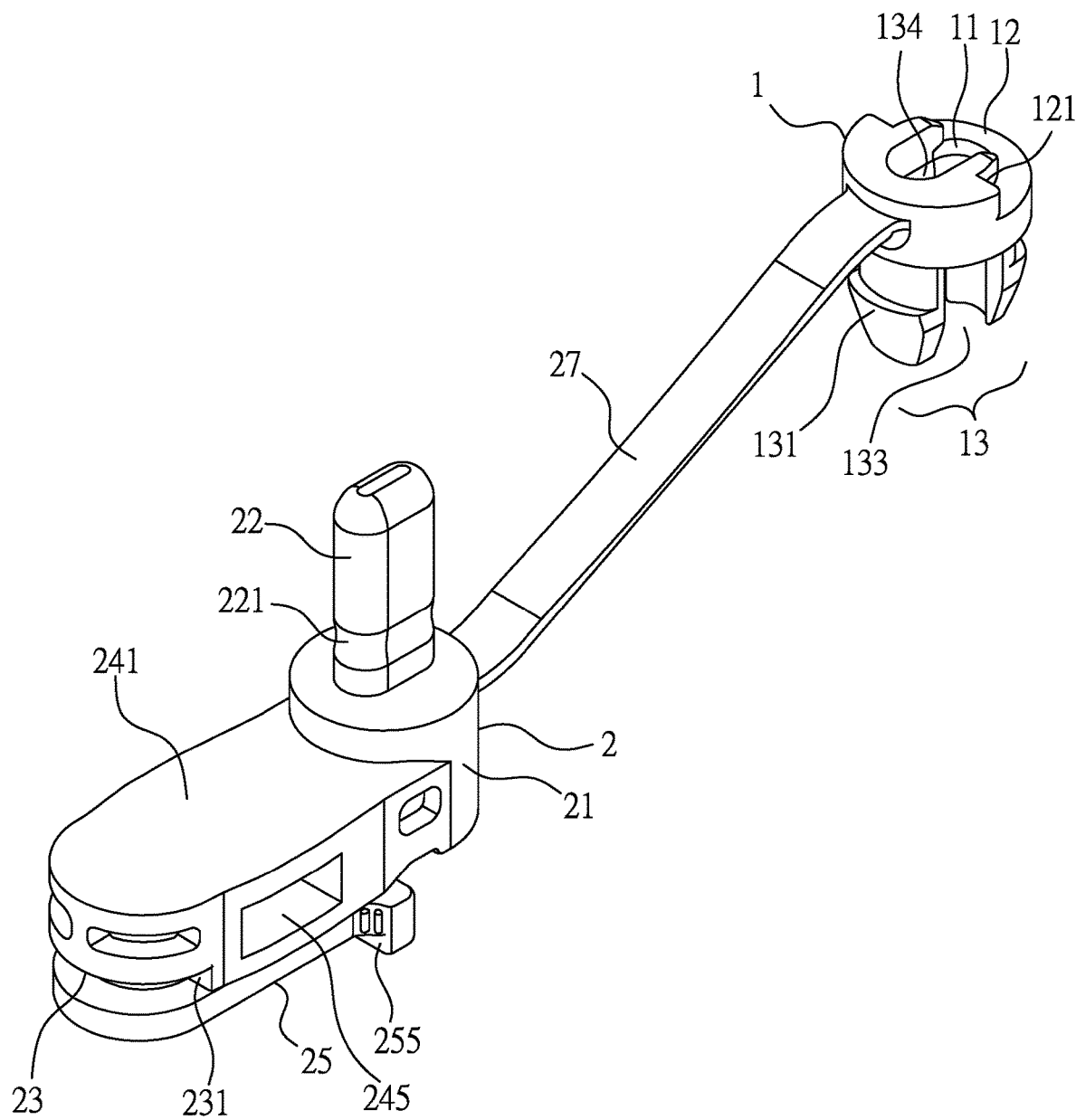
FIG. 4 is another perspective view illustrating the assembly of the fastener according to the present invention.
Figure 9:
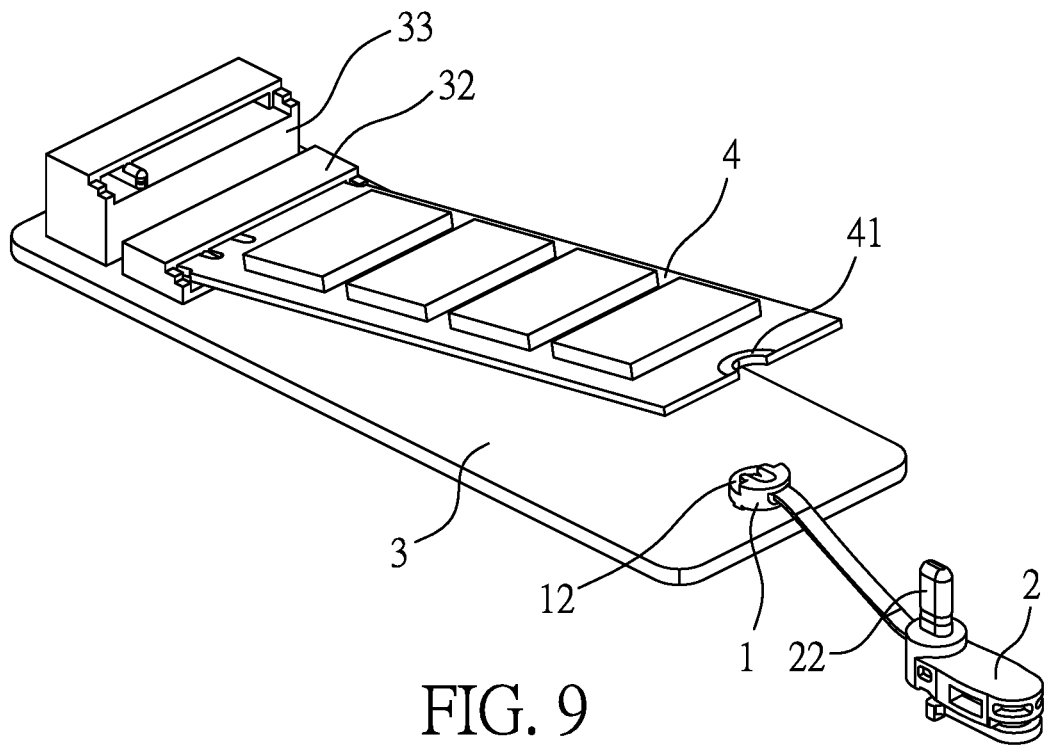
Figure 10:
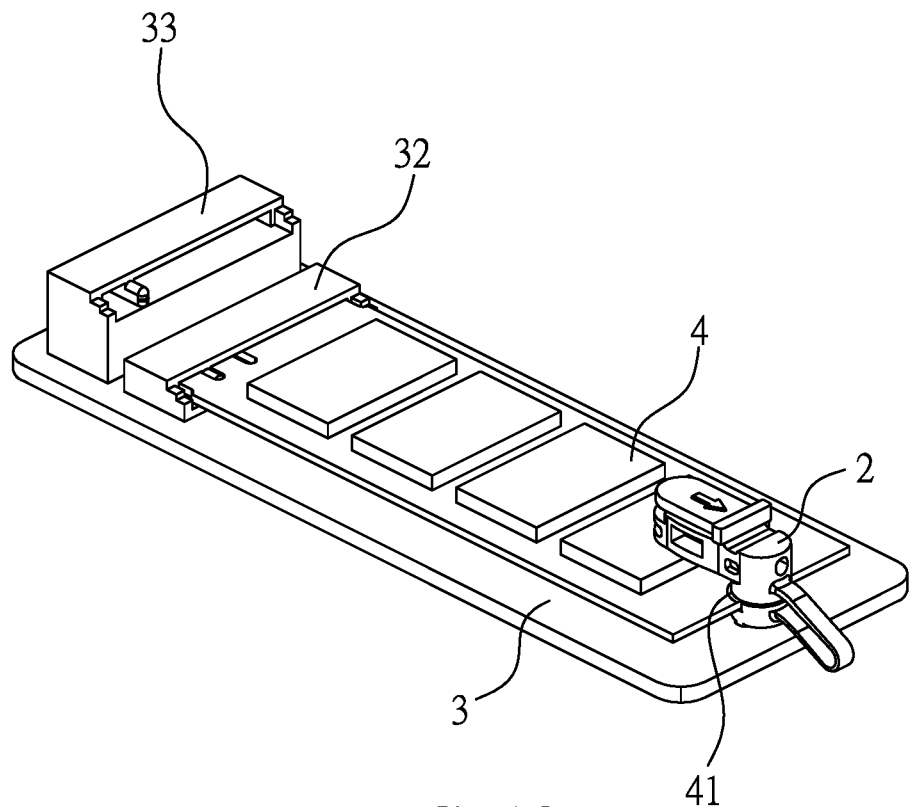

An insertion hole 11 is axially formed in the positioning unit 1, and the insertion hole 11 is preferably not in a round shape in actual practices; as shown in FIG. 2 and FIG. 4, the insertion hole 11 is in a round-and-long-shape, but what shall be addressed is that the scope of the present invention is not limited to the above-mentioned arrangement, other shapes, for example a polygonal shape or an oval shape can also be adopted. A first supporting concave part 12 is radially formed on one surface, for example a top surface, of the positioning unit 1, the first supporting concave part 12 allows a first positioning recess 41 at one end of a first electronic device 4 (as shown in FIG. 9 and FIG. 10) to be disposed, and two sides of the first supporting concave part 12 have a pair of first blocking edges 121 abutting against the first positioning recess 41, thereby providing an anti-rotation effect to the first electronic device 4.

Figure 1:
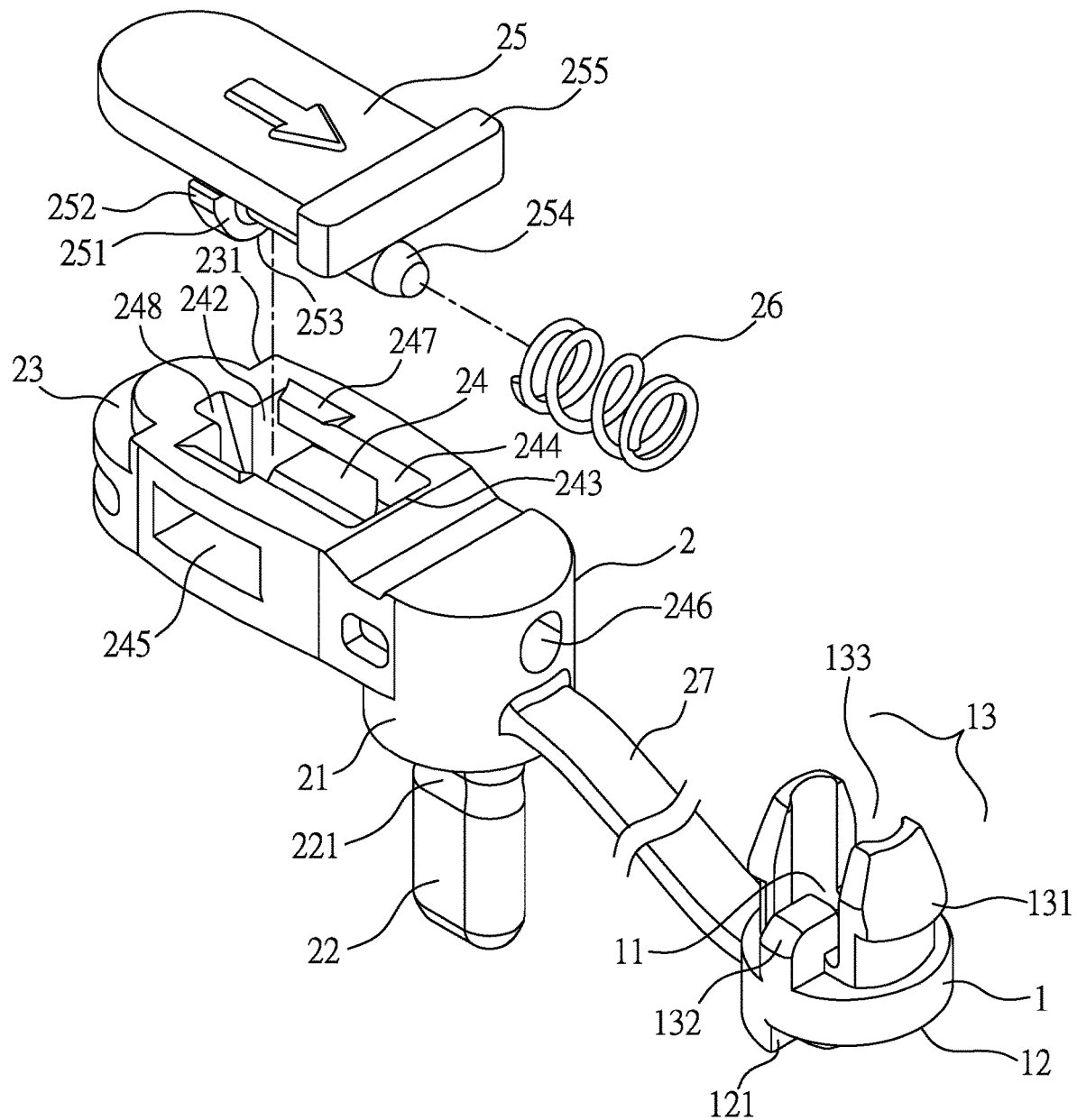
FIG. 1 is a perspective exploded view illustrating the fastener according to the present invention.
Figure 3:
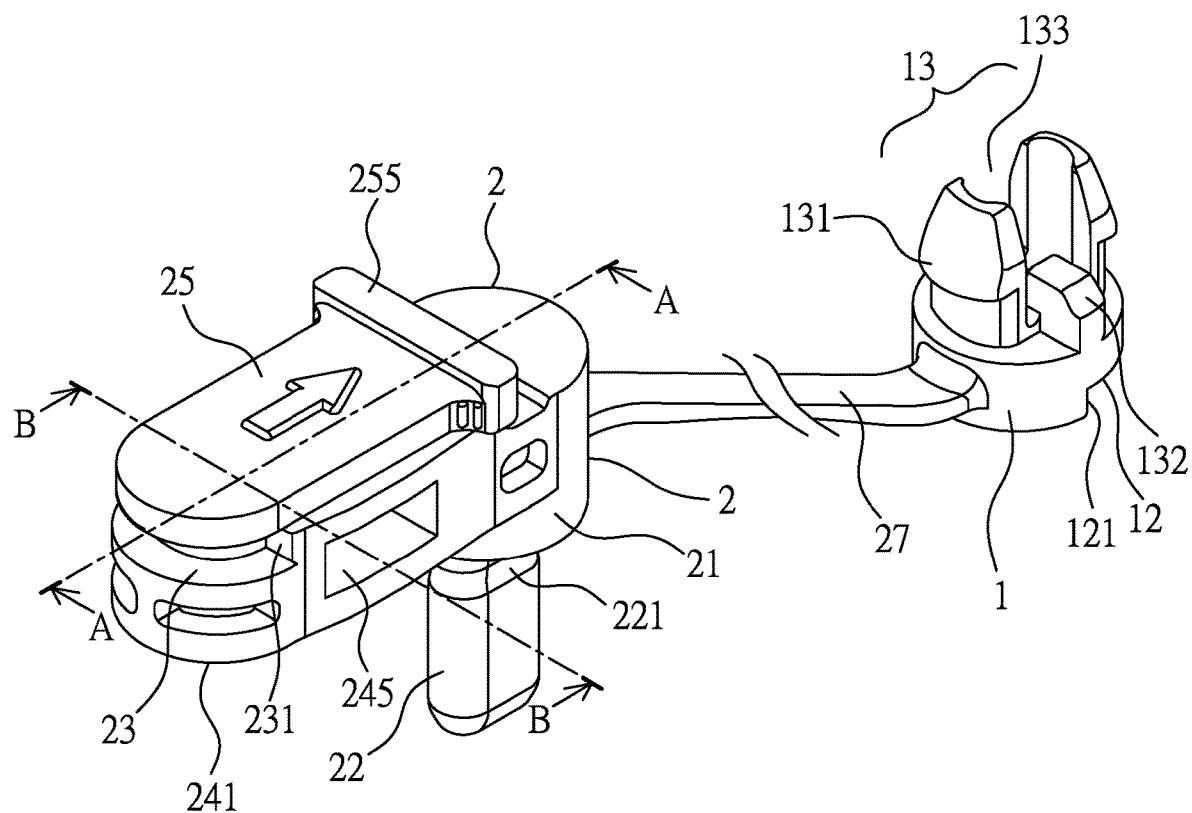
FIG. 3 is a perspective view illustrating the assembly of the fastener according to the present invention.
Figure 7:
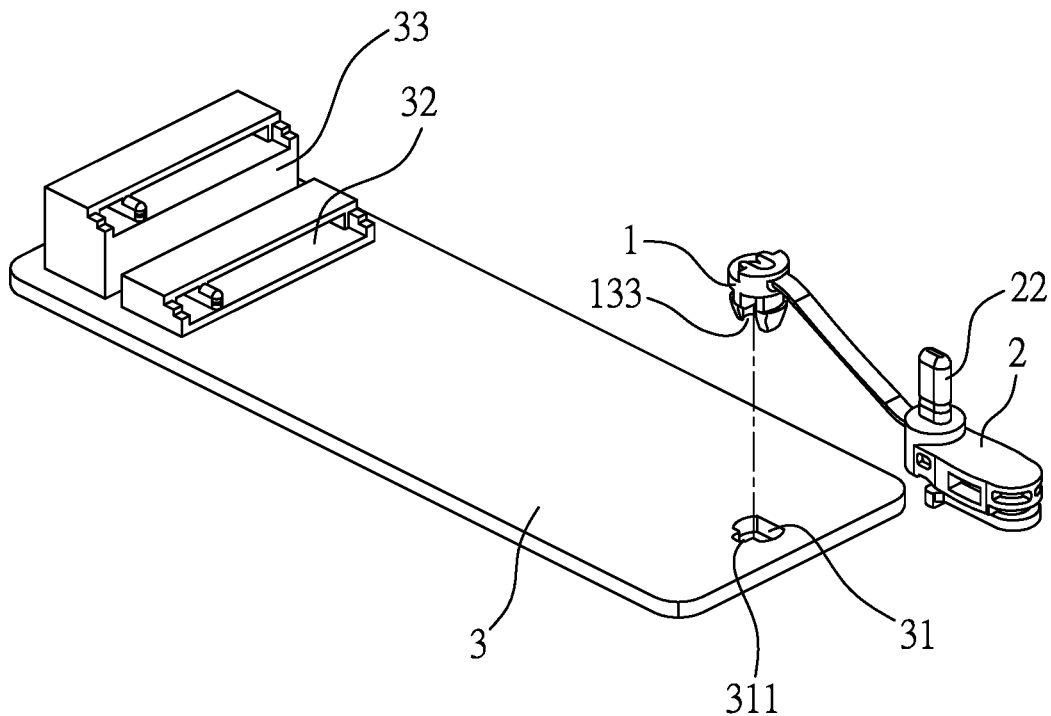
FIG. 7 to FIG. 12 are schematic views illustrating an assembling process of the fastener shown in FIG. 1, electronic devices and a board member according to the present invention.
Figure 8:
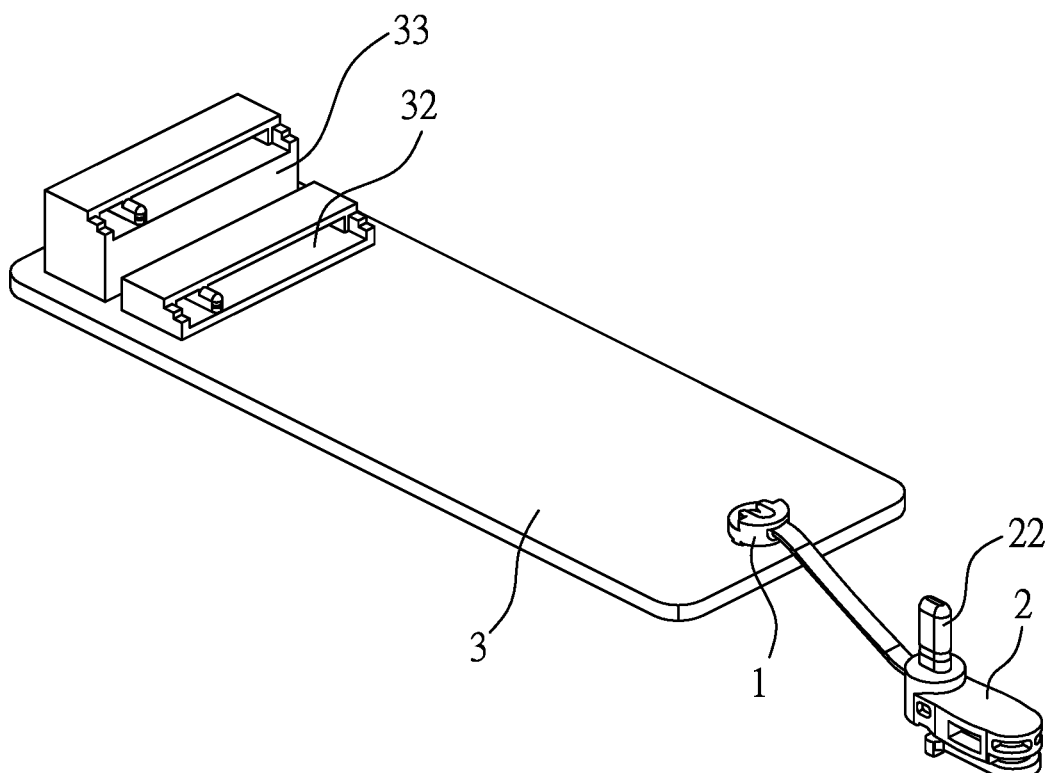

Another surface of the positioning unit 1 has a positioning structure 13 communicating with the insertion hole 11; as shown in FIG. 1 and FIG. 3, the positioning structure 13 has at least two buckle hooks 131 annularly arranged and protruded from a circumference of the insertion hole 11. The buckle hooks 13 are used for combining, for example for buckling, with a board member 3, for example a board hole 31 (as shown in FIG. 7) of a printed circuit board, so that the positioning unit 1 can be fastened on the board member 3 (as shown in FIG. 8). What shall be addressed is that the scope of the present invention is not limited to the above-mentioned arrangement of the positioning structure 13, any other technical solution enabling the positioning unit 1 to be connected to the board member 3 shall be within the scope of the present invention.

For preventing the positioning unit 1 from rotating in the board hole 31, a rotation preventing protrusion 132 protruding from the circumference of the insertion hole 11 is disposed between every two of the adjacent buckle hooks 131, and a rotation preventing hole 311 communicating with the board hole 31 is formed in the board hole 31 at a location corresponding to the rotation preventing protrusion 132, so that when the buckle hooks 131 are buckled in the board hole 31, the rotation preventing protrusion 132 is received in the rotation preventing hole 311, thereby preventing the positioning unit 1 from rotating in the board hole 31.

The clamping member 2 has a main body 21, a fastening pin 22 inserted in the insertion hole 11 is disposed at a bottom end of the main body 21, a cross section of the fastening pin 22 is formed in a shape which is the same as the insertion hole 11, and a length of the fastening pin 22 is greater than a depth of the insertion hole 11, thus the fastening pin 22 is allowed to protrude into a penetrated slot 133 formed between the buckle hooks 131, and the buckle hooks 131 can be prevented from inwardly retracting and deforming, the buckle hooks 131 are able to be firmly buckled in the board hole 31, thereby enabling the positioning unit 1 to be fastened with the board member 3 and achieving a positioning effect. Accordingly, when a bottom surface of the main body 21 and the first supporting concave part 12 jointly clamp the first positioning recess 41 of the first electronic device 4, the first electronic device 4, for example the M.2 solid state drive, is formed in a locked status.

As a matter of fact, an advantage achieved via installing the rotation preventing protrusion 132 is that when the buckle hooks 131 are inserted in the board hole 31, and the fastening pin 22 is yet inserted in the penetrated slot 133 formed between the insertion hole 11 and the buckle hooks 131, the buckle hooks 131 do not abut against the fastening pin 22 so as to be provided with an inwardly retracting property, and a problem of rotation may cause. As such, when the rotation preventing protrusion 132 is received in the rotation preventing hole 311, the positioning unit 1 is prevented from rotating in the board hole 31, meanwhile the first supporting concave part 12 can be oriented towards a first connector 32 of the board member 3, thereby providing effects of positioning and anti-error installing.

Moreover, an anti-loosening structure is correspondingly disposed adjacent circumferences of the fastening pin 22 and the insertion hole 11, the anti-loosening structure has at least one anti-loosening buckle slot 211 formed at an outer circumference of the fastening pin 22, and an anti-loosening buckle ring 134 disposed at an inner circumference of the insertion hole 11. With the anti-loosening structure, the fastening pin 22 can be prevented from axially loosening after the fastening pin 22 is inserted in the insertion hole 11. According to another embodiment of the present invention, the anti-loosening structure has an anti-loosening buckle ring formed at the outer circumference of the fastening pin 22, and at least one anti-loosening buckle slot formed at the inner circumference of the insertion hole 11, and the aforesaid anti-loosening effect can also be provided.

Figure 11:
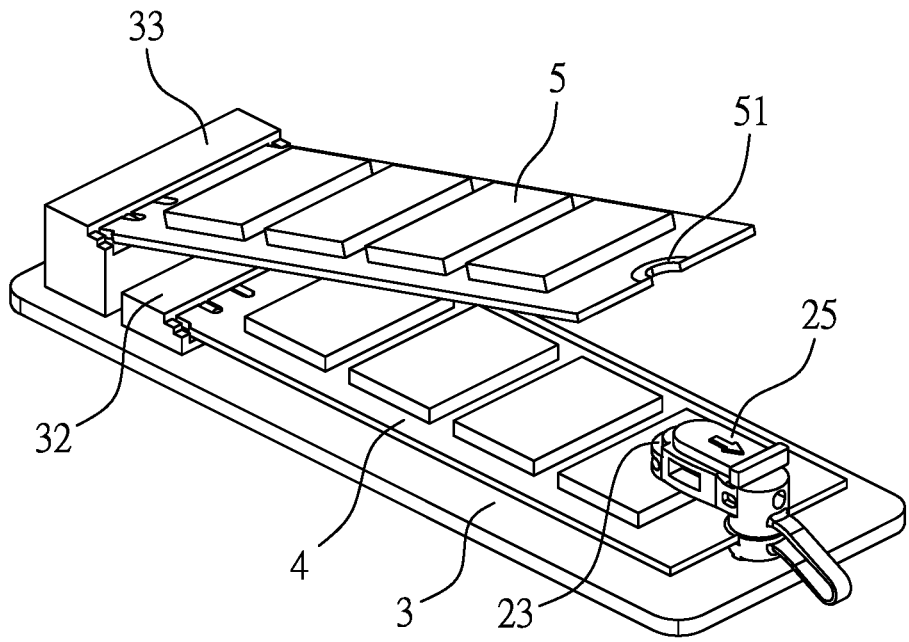
Figure 12:
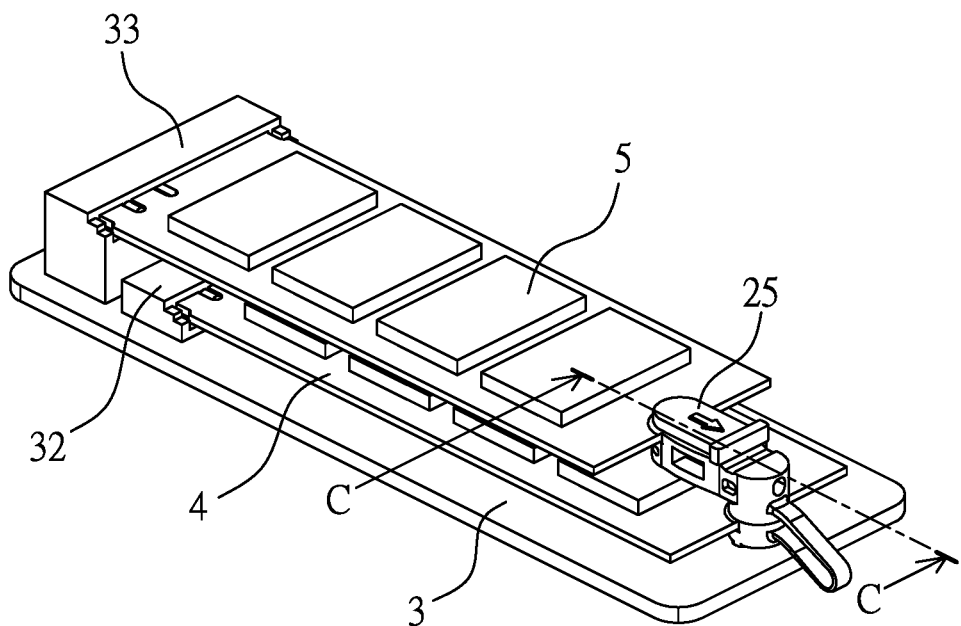

The main body 21 has a second supporting concave part 23 radially formed on the fastening pin 22, the second supporting con cave part 23 allows a second positioning recess 51 at one end of a second electronic device 5 (as shown in FIG. 11 and FIG. 12) to be disposed, and two sides of the second supporting concave part 23 have a pair of second blocking edges 231 abutting against the second positioning recess 51, thereby enabling the second electronic device 5 to provide a rotation preventing effect.

A chamber 24 is disposed at a location adjacent to one side of the second supporting concave part 23, the chamber has 24 a front wall 242 and a rear wall 243 oppositely arranged above a bottom wall 241, and a pair of lateral walls 244 connected between the front wall 242 and the rear wall 243, so that the chamber 24 is defined between the bottom wall 241, the front wall 242, the rear wall 243 and the pair of lateral walls 244. Wherein, the pair of lateral walls 244 are radially and oppositely formed with a pair of sliding slots 245, and a rod hole 246 is radially formed on the rear wall 243. Moreover, the pair of lateral walls 244 are correspondingly formed with a pair of guiding inclined surfaces 247 arranged above the pair of sliding slots 245, so that a sliding cover 25 can be disposed. Furthermore, the front wall 242 has an accommodation slot 248.

Figure 6:
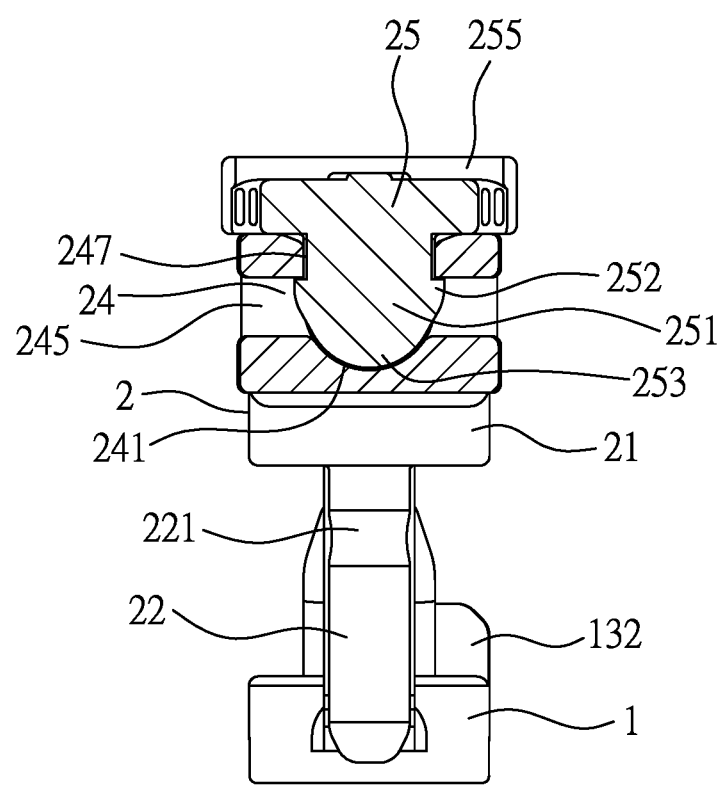
FIG. 6 is a cross sectional view of FIG. 3 taken along a B-B line.

The sliding cover 25 has a sliding sheet 251 axially protruded from a bottom surface thereof so as to be disposed in the chamber 24, two sides of the sliding sheet 251 have a pair of sliding hooks 252 buckled in the pair of sliding slots 245, so that the sliding cover 25 is able to forwardly/backwardly slide relative to the chamber 24. The sliding sheet 251 has a guiding arc-shaped surface 253 arranged between the pair of sliding hooks 252, thus when the guiding arc-shaped surface 253 displaces along the pair of guiding inclined surfaces 247, the pair of guiding inclined surfaces 247 can be formed in a slightly expanding and deforming status for allowing the pair of sliding hooks 252 to smoothly pass the pair of the guiding inclined surfaces 247 so as to be buckled in the pair of sliding slots 245, thereby preventing the sliding cover 25 from axially releasing relative to the chamber 24 (as shown in FIG. 6).

What shall be addressed is that the pair of sliding hooks 252 and the sliding sheet 251 are integrally formed, thereby avoiding a problem of deformation. Moreover, the pair of sliding hooks 252 slide in the pair of sliding slots 245 inside the chamber 24, thus the pair of sliding hooks 252 would not be in contact with electronic components on the board member 3, for example the printed circuit board, thereby avoiding an interfering situation from happening, and the stability and the smoothness in operations are provided.

Figure 5:
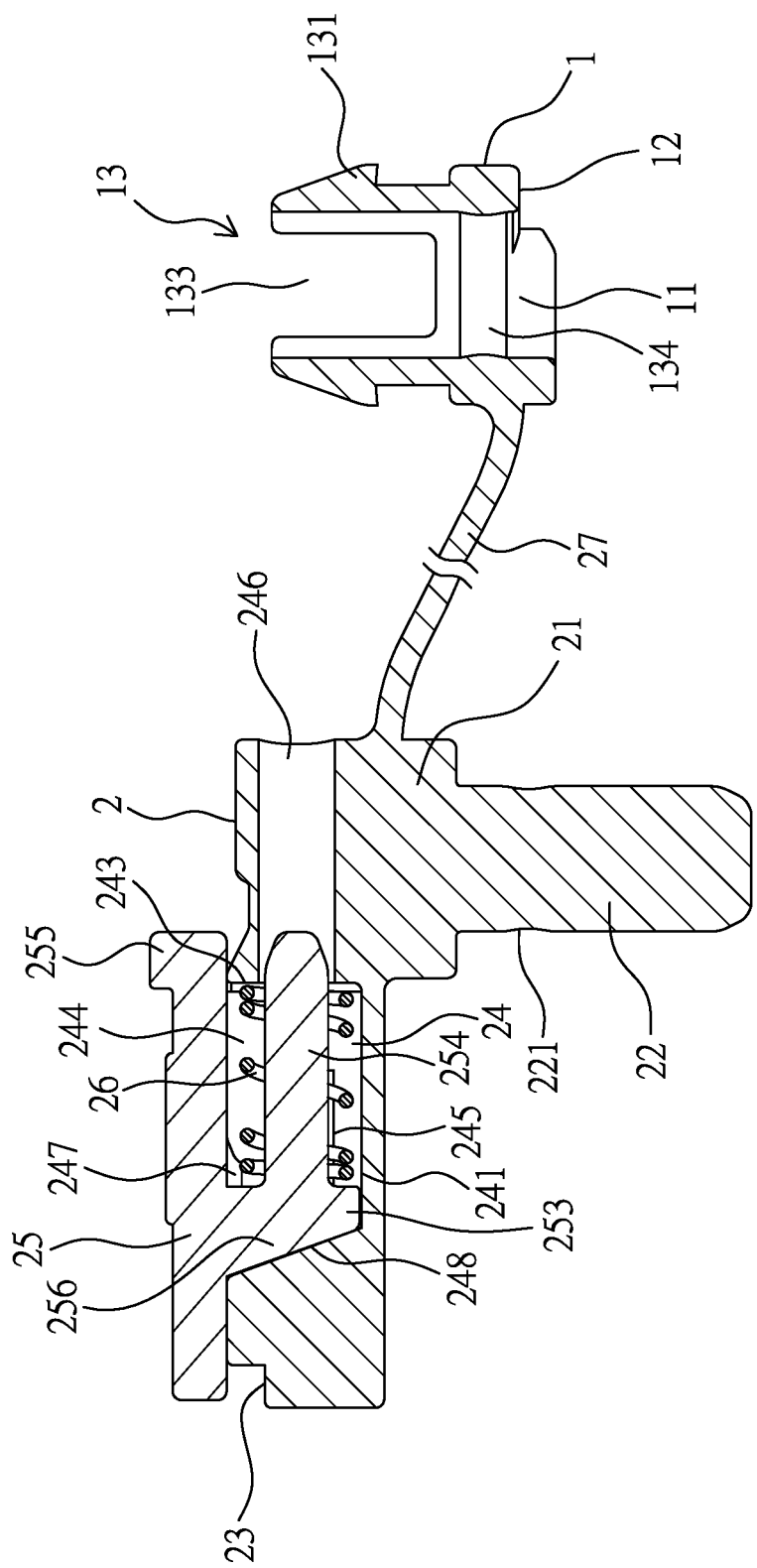
FIG. 5 is a cross sectional view of FIG. 3 taken along an A-A line.

A sliding rod 254 is radially protruded from a backside of the sliding sheet 251, the sliding rod 254 is sleeved with a spring 26 then inserted in the rod hole 246, thus the spring 26 is located between the sliding sheet 251 and the rear wall 243 (as shown in FIG. 5), with an elastic stretching effect (energy releasing) provided by the spring 26, a front end of the sliding cover 25 is able to be constantly located above the second supporting concave part 23, thereby forming a locked status to the second electronic device 5, for example the M.2 solid state drive.

At least one flange 255 is protruded from a rear end of the sliding cover 25. When being operated, the at least one flange 255 of the sliding cover 25 allows a user to easily hold for applying a backward force, thereby forming an unlocked status, the pair of sliding hooks 252 are able to backwardly slide along the pair of sliding slots 245, meanwhile the sliding sheet 251 compresses the spring 26 (for a purpose of storing energy), thus the front end of the sliding cover 25 displaces out from the second supporting concave part 23 so as to form the unlocked status. At this moment, the second electronic device 5 can be installed by the user or the second electronic device 5 is replaced.

Moreover, a reinforcing rib 256 is integrally protruded from a front end of the sliding sheet 251, the reinforcing rib 256 is received and abutted against the accommodation slot 248 (as shown in FIG. 5), thereby preventing the sliding sheet 251 from deforming.

Furthermore, a connecting strip 27 is disposed between the positioning unit 1 and the clamping member 2, so that the positioning unit 1 can be prevented from lost, meanwhile the positioning unit 1, the clamping member 2 and the connecting strip 27 are allowed to be formed through a high polymer insulation material being processed with an injection molding treatment.

Please refer to FIG. 3 and FIG. 4, which are perspective views illustrating the sliding cover 25 and the spring 26 being disposed in the chamber 24 with respect to the aforesaid disclosures; and please refer to FIG. 5 and FIG. 6, which are cross sectionals view of FIG. 3 taken along an A-A line and a B-B line. As shown in FIG. 5, after the sliding rod 245 is sleeved with the spring 26 and inserted in the rod hole 246, the spring 26 is located between the sliding sheet 251 and the rear wall 243, so that the front end of the sliding cover 25 is able to be constantly located above the second supporting concave part 23. As shown in FIG. 6, the pair of sliding hooks 252 are buckled in the pair of sliding slots 245, thereby preventing the sliding cover 25 from axially releasing relative to the chamber 24

Please refer from FIG. 7 to FIG. 12, which are schematic views illustrating an assembling process of the fastener, the board member 3, the first electronic device 4 and the second electronic device 5. As shown from FIG. 7 to FIG. 9, the board hole 31 are axially formed at one end of the board member 3, and the rotation preventing hole 311 are radially communicated with the board hole 31; a first connector 32 and a second connector 33 are disposed at another end of the board member 31, and a height difference is formed between the first connector 32 and the second connector 33, in other words a spacing distance being formed. When being assembled, the positioning structure 13, for example the buckle hooks 131 and the rotation preventing protrusion 132, of the positioning unit 1 are aimed and inserted in the board hole 31 and the rotation preventing hole 311 by an operator in an assembling factory, so that the positioning unit 1 is positioned on the board member 3, and the first supporting concave part 12 is located opposite to the first connector 32.

A contact part (not shown in figures due to a projecting angle) at one end of the first electronic device 4 is inserted and connected to the first connector 32 on the board member 3, and the first positioning recess 41 at another end of the first electronic device 4 is arranged to across the first supporting concave part 12.

As shown in FIG. 10, the fastening pin 22 of the clamping member 2 is inserted in the insertion hole 11 so as to protrude into the penetrated slot 133, the positioning unit 1 and the board member 3 are formed with a firmly positioning effect, with the bottom surface of the main body 21 and the first supporting concave part 12 jointly clamping the first positioning recess 41 of the first electronic device 4, the first electronic device 4 is formed with a firmly positioning effect, and a situation of shaking can be avoided, thereby ensuring an electrical connection of the first electronic device 4 and the first connector 32.

Please refer to FIG. 11 and FIG. 12, a contact part (not shown in figures due to a projecting angle) at one end of the second electronic device 5 is inserted and connected to the second connector 33 on the board member 3. An external force is applied to the sliding cover 25 for being backwardly displaced, the spring 26 is in the energy storing status and the unlocked status is formed, meanwhile after the second supporting concave part 23 is exposed, the second positioning recess 51 at another end of the second electronic device 5 is arranged to across the second supporting concave part 23. Lastly, the sliding cover 25 is released by the operator, and the sliding cover 25 is able to return to an initial location, in other words being above the second supporting concave part 23, via the energy releasing effect of the spring 26, thus the sliding cover 25 and the second supporting concave part 23 are able to jointly clamp the second positioning recess 51 of the second electronic device 5, the second electronic device 5 is formed with a firmly positioning effect, and a situation of shaking can be avoided, thereby ensuring an electrical connection of the second electronic device 5 and the second connector 33.

Figure 13:
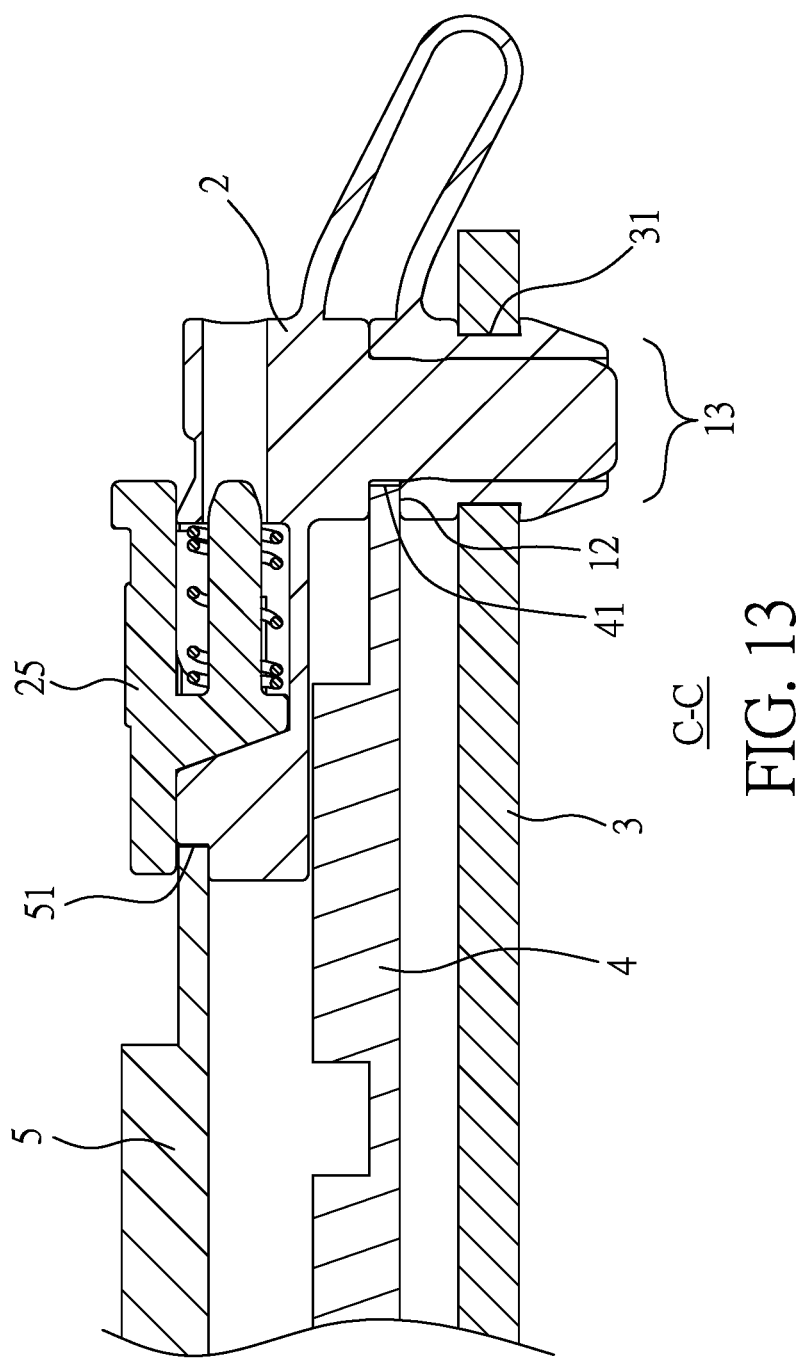
FIG. 13 is a partially enlarged cross sectional view of FIG. 12 taken along a C-C line.

Please refer to FIG. 13, which a partially enlarged cross sectional view of FIG. 12 taken along a C-C line. As shown in FIG. 13, relative location relations of the board member 3, the first electronic device 4 and the second electronic device 5 are easily to be understood, wherein the board hole 31 of the board member 3 allows the positioning structure 13 of the positioning unit 1 to be disposed and positioned, the first positioning recess 41 of the first electronic device 4 is arranged to across the first supporting concave part 12 of the positioning unit 1, and abut against the bottom surface of the main body 21 of the clamping member 2 so as to form a first locked status, and the second positioning recess 51 of the second electronic device 5 is arranged to across the second supporting concave part 23 of the clamping member 2 and abut against the sliding cover 25 so as to form a second locked status.

Based on what has been disclosed above, advantages achieved by the present invention are as follows. The fastener allows one or more electronic devices to be disposed thereon so as to save an internal space of an electronic product, thus the stably electrical connection can be established between the one or more electronic devices and the connector corresponding disposed on the board member, for example the printed circuit board, thereby ensuring the one or more electronic devices to be normally operated. Accordingly, the fastener for use in the electronic device provided by the present invention is novel and more practical in use comparing to prior arts.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A fastener for use in an electronic device, including:
a positioning unit, axially formed with an insertion hole, wherein a first supporting concave part allowing a first electronic device to be disposed is radially formed on one surface of said positioning unit, and another surface thereof has a positioning structure communicating with said insertion hole and allowing a board member to be connected; and
a clamping member, having a main body, wherein a fastening pin inserted in said insertion hole is disposed at a bottom end of said main body, so that said bottom end of said main body enables said first electronic device disposed on said first supporting concave part to be in a locked status; said main body has a second supporting concave part allowing a second electronic device to be disposed and radially formed at a location opposite to said fastening pin, wherein an axial spacing distance is formed between said first supporting concave part and said second supporting concave part, a chamber is disposed at a location adjacent to one side of said second supporting concave part, said chamber has a pair of sliding slots oppositely arranged and a rod hole; and a sliding cover, having a sliding sheet axially protruded from a bottom surface thereof so as to be disposed in said chamber, two sides of said sliding sheet have a pair of sliding hooks buckled in said pair of sliding slots, and a sliding rod is protruded from said sliding sheet and sleeved with a spring, and said spring is located between said sliding sheet and said chamber; with said sliding cover sliding or being released, said spring is able to be in an energy storing status or an energy releasing status, so that a front end of said sliding cover is able to be released or be located above said second supporting concave part, thereby enabling said second electronic device to be in an unlocked status or a locked status.

2. The fastener for use in the electronic device as claimed in claim 1, wherein said insertion hole is not a round hole, and a cross section of said fastening pin is formed in a shape which is the same as said insertion hole.

3. The fastener for use in the electronic device as claimed in claim 1, wherein two sides of said first supporting concave part have a pair of first blocking edges abutting against a first positioning recess of said first electronic device; and two sides of said second supporting concave part have a pair of second blocking edges abutting against a second positioning recess of said second electronic device.

4. The fastener for use in the electronic device as claimed in claim 1, wherein said positioning structure has at least two buckle hooks annularly arranged and protruded from a circumference of said insertion hole, said buckle hooks are used for being buckled in a board hole of said board member; wherein a length of said fastening pin is greater than a depth of said insertion hole, thus said fastening pin is allowed to protrude into a penetrated slot formed between said buckle hooks, and said buckle hooks are prevented from inwardly retracting and deforming.

5. The fastener for use in the electronic device as claimed in claim 4, wherein a rotation preventing protrusion protruding from a circumference of said insertion hole is disposed between every two adjacent said buckle hooks, and said rotation preventing protrusion is inserted in a rotation preventing hole communicating with said board hole.

6. The fastener for use in the electronic device as claimed in claim 1, further including a connecting strip, one end of said connecting strip is connected to said positioning unit, and another end thereof is connected to said main body of said clamping member, so that said positioning unit, said clamping member and said connecting strip are allowed to be formed through a high polymer insulation material being processed with an injection molding treatment.

7. The fastener for use in the electronic device as claimed in claim 1, wherein an anti-loosening structure is correspondingly disposed at adjacent circumferences of said fastening pin and said insertion hole.

8. The fastener for use in the electronic device as claimed in claim 7, wherein said anti-loosening structure has at least one anti-loosening buckle slot formed at an outer circumference of said fastening pin, and an anti-loosening buckle ring disposed at an inner circumference of said insertion hole; or said anti-loosening structure has an anti-loosening buckle ring formed at said outer circumference of said fastening pin, and at least one anti-loosening buckle slot formed at said inner circumference of said insertion hole.

9. The fastener for use in the electronic device as claimed in claim 1, wherein said chamber has a front wall and a rear wall oppositely arranged above a bottom wall, and a pair of lateral walls connected between said front wall and said rear wall; wherein, said pair of sliding slots are oppositely formed on said pair of lateral walls, and said rod hole is formed on said rear wall.

10. The fastener for use in the electronic device as claimed in claim 9, wherein said pair of lateral walls are correspondingly formed with a pair of guiding inclined surfaces arranged above said pair of sliding slots, said sliding sheet has a guiding arc-shaped surface arranged between said pair of sliding hooks; when said guiding arc-shaped surface displaces along said pair of guiding inclined surfaces, said pair of guiding inclined surfaces are formed in a slightly expanding and deforming status for allowing said pair of sliding hooks to smoothly pass said pair of guiding inclined surfaces so as to be buckled in said pair of sliding slots.

11. The fastener for use in the electronic device as claimed in claim 9, wherein said front wall has an accommodation slot, a reinforcing rib is integrally protruded from said sliding sheet at a location corresponding to said accommodation slot, and said reinforcing rib is received and abutted against said accommodation slot.

* * * * *